United States Patent
Asao et al.

(10) Patent No.: US 6,650,387 B1
(45) Date of Patent: Nov. 18, 2003

(54) LIQUID CRYSTAL DEVICE HAVING A SUBSTRATE PROVIDED WITH PORTIONS OF AN ALIGNMENT CONTROL LAYER AND CARRIER-TRANSPORTING DEVICE AND LIGHT-EMITTING DEVICE USING THE LIQUID CRYSTAL DEVICE

(75) Inventors: Yasufumi Asao, Atsugi (JP); Yukio Hanyu, Isehara (JP); Koichi Sato, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/544,162

(22) Filed: Apr. 6, 2000

(30) Foreign Application Priority Data

Apr. 8, 1999 (JP) .......................................... 11-100951

(51) Int. Cl.⁷ ..................... G02F 1/141; G02F 1/1337; C09K 19/02; C09K 19/00; C09K 19/52
(52) U.S. Cl. ..................... 349/133; 349/123; 349/129; 349/172; 349/184; 428/1.1; 252/299.01
(58) Field of Search ................. 349/123, 129, 349/133, 172, 184, 174; 252/299.01; 428/1.1

(56) References Cited

U.S. PATENT DOCUMENTS

| | | | | |
|---|---|---|---|---|
| 5,798,056 A | * | 8/1998 | Nakamura | 252/299.01 |
| 5,825,447 A | * | 10/1998 | Hanyu et al. | 252/299.01 |
| 5,932,136 A | | 8/1999 | Terada et al. | 252/299.01 |
| 6,195,147 B1 | * | 2/2001 | Asao et al. | 349/129 |

OTHER PUBLICATIONS

Appl. Phys. Lett., vol. 51 (12) (Sep. 1987), pp. 913–915.
Applied Physics A, vol. 68, No. 1 (Jan. 1999), pp. 25–28.
Advance Materials, vol. 8, p. 823 (1996).

* cited by examiner

*Primary Examiner*—Tarifur R. Chowdhury
(74) *Attorney, Agent, or Firm*—Fitzpatrick, Cella, Harper & Scinto

(57) ABSTRACT

A liquid crystal device includes a highly aligned liquid crystal over an entire area including regions not provided with a uniaxial alignment film. A carrier-transporting device and a light-emitting device incorporate such a liquid crystal device.

6 Claims, 6 Drawing Sheets

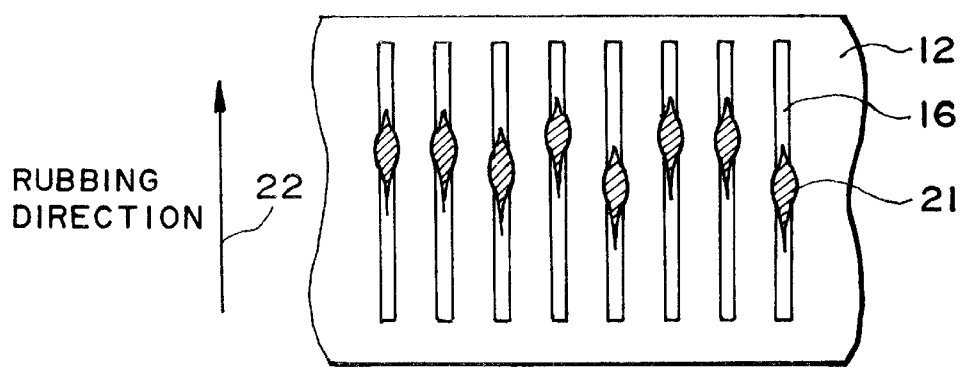
F I G. 2A
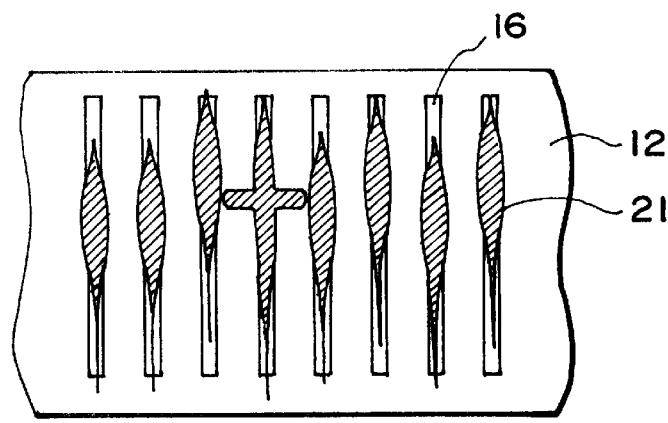
F I G. 2B
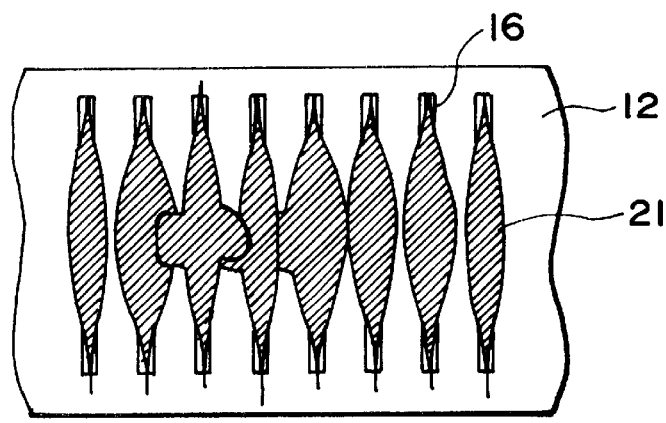
F I G. 2C

RUBBING DIRECTION → 22

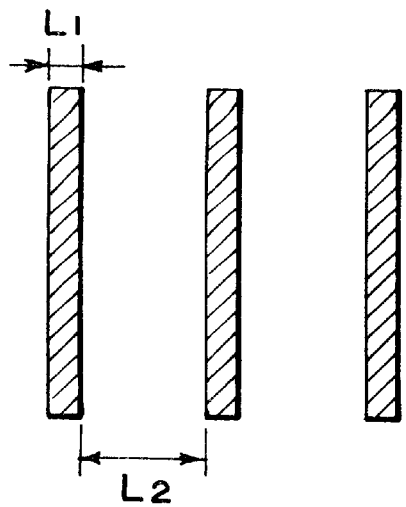
F I G. 7
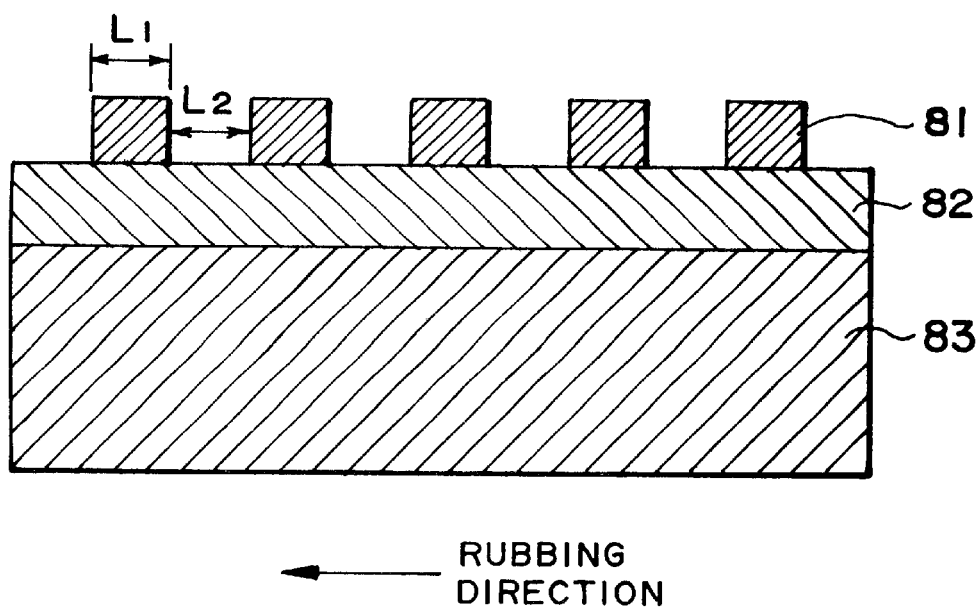
F I G. 8

LIQUID CRYSTAL DEVICE HAVING A SUBSTRATE PROVIDED WITH PORTIONS OF AN ALIGNMENT CONTROL LAYER AND CARRIER-TRANSPORTING DEVICE AND LIGHT-EMITTING DEVICE USING THE LIQUID CRYSTAL DEVICE

BACKGROUND OF THE INVENTION

The present invention relates to a novel liquid crystal device, a production method therefor, and a liquid crystal alignment control method, as well as to a light-emitting device, such as an LED, and a carrier-transporting device suitable for electrophotography, etc., using the liquid crystal device.

In recent years, carrier-transporting devices, such as semiconductor devices, using organic compounds have been studied. One of the most popular examples thereof is an organic photosensitive semiconductor (OPC) for electrophotography, and it is widely used in electrophotographic copying machines and printers in view of its excellent productivity and functionality. Further, in recent years, extensive research and development has been conducted on the utilization of organic materials also in light-emitting devices such as EL (electroluminescence) devices and LED (light-emitting diode) devices. For example, there are reported a study for remarkable improvement in organic EL device functions by functional separation of a carrier-transporting layer and a light-emitting layer by C. W. Tang, et al. (Appl. Phys. Lett., vol. 51, p. 913 (1987)) and several recent studies showing improved reliability by Pioneer K.K. (e.g., Flat Panel Display, p. 212 (1999) published from Nikkei BP K.K.).

Under these circumstances, there is a trend to use liquid crystal materials in carrier-transporting devices such as semiconductor devices or light-emitting devices such as EL devices and LED devices. This is based on the idea of utilizing a highly ordered liquid crystal structure for preparing high performance devices. For example, Hanna has reported a study on liquid crystalline organic semiconductor materials (Oyo Buturi, Appl. Phys., vol. 68 (1), p. 26 (1999)), wherein a high carrier-transporting characteristic of smectic liquid crystal has been confirmed. Further, A.M. Van de Craats, et al., has also confirmed a high carrier-transporting characteristic of discotic liquid crystal (Adv. Mater., vol. 8, p. 823 (1996)).

Notably, in order to use a liquid crystal in a highly aligned state, the presence of an alignment film (alignment control film) for realizing the aligned state is ordinarily indispensable; however, such an alignment film is liable to obstruct the performances of the above-mentioned type of functional devices. As a result, alignment films have not been used in most of the previous studies, and in some cases where such an alignment film is used, the alignment film is not allowed to directly contact the liquid crystal layer and another layer, typically electrodes. This results in a remarkable decrease in performance, particularly in EL and LED devices. Accordingly, it has become impossible to utilize a liquid crystal in its highly aligned state in most cases. The use of such a highly aligned liquid crystal has been possible by exceptional methods such as shearing a liquid crystal between the substrates or sandwiching a discotic liquid crystal between two substrates. However, the former method has a drawback of poor productivity with regard to reproducibility and the production of large-area devices. The latter method allows only a structure of using two rigid substrates, such as glass plates, and the uniformity of alignment is still insufficient. Further, the method is applicable to discotic liquid crystals only.

Under the circumstances, it has been earnestly desired to develop a method, an organization or a device capable of highly aligning extensive liquid crystal materials inclusive of nematic and smectic liquid crystals that can be provided with a uniaxial alignment characteristic, while obviating a performance obstruction caused by an alignment film. Further, because of such circumstances, the proposal of new functional devices utilizing a highly aligned state of liquid crystal has been severely restricted.

SUMMARY OF THE INVENTION

In view of the above-mentioned problems of the prior art, an object of the present invention is to provide a liquid crystal device wherein a high order of liquid crystal alignment state is realized.

Other objects of the present invention are to provide a carrier-transporting device and a light-emitting device utilizing such a liquid crystal device.

According to the present invention, there is provided a liquid crystal device comprising a substrate having an electrode thereon, and a liquid crystal disposed on the substrate, wherein the substrate is provided with portions of an alignment control layer having a uniaxial alignment control power locally formed thereon, whereby the liquid crystal is placed in an alignment state which has been formed through a process of liquid-liquid crystal phase transition on temperature decrease wherein a liquid crystal phase is first generated in regions in contact with the portion of alignment control layer and continuously enlarged in a direction of the uniaxial alignment control power.

The present invention further provides a method for alignment control of a liquid crystal comprising the steps of: providing a liquid crystal device including a substrate having an electrode thereon, and a liquid crystal disposed on the substrate, wherein the substrate is provided with portions of an alignment control layer having a uniaxial alignment control power locally formed thereon, and cooling the liquid crystal from its liquid phase to its liquid crystal phase, thereby generating a liquid crystal phase of the liquid crystal in regions in contact with the portions of the alignment control layer and enlarging the liquid crystal phase regions in a direction of the uniaxial alignment control power to form an alignment state of the liquid crystal phase over the substrate.

According to another aspect of the present invention, there is further provided a method of producing a liquid crystal device including a substrate having an electrode thereon, and a liquid crystal disposed on the substrate comprising the steps of: forming portions of an alignment control layer having a uniaxial alignment control power locally selectively on the substrate, placing the liquid crystal by application or vapor deposition over the portions of the alignment control layer on the substrate, and cooling the liquid crystal from its liquid phase to its liquid crystal phase, thereby generating a liquid crystal phase of the liquid crystal in regions in contact with the portions of the alignment control layer and enlarging the liquid crystal phase regions in a direction of the uniaxial alignment control power to form an alignment state of the liquid crystal phase over the substrate.

The present invention further provides a carrier-transporting device comprising the above-mentioned liquid crystal device, wherein the liquid crystal comprises a liquid crystal having a charge-transporting function in the liquid crystal phase and a light-emitting device comprising the above-mentioned liquid crystal device and including a light-emitting layer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2C are schematic plan views for illustrating typical states of alignment development in a liquid crystal device according to the invention during an isotropic-smectic phase transition process as observed through a polarizing microscope.

FIG. 7 is a schematic plan view of a mask structure used in the examples.

FIG. 8 is a schematic sectional view of a substrate used in Example 1.

DESCRIPTION OF THE PREFERRED EMBODIMENTS

Figure 1:
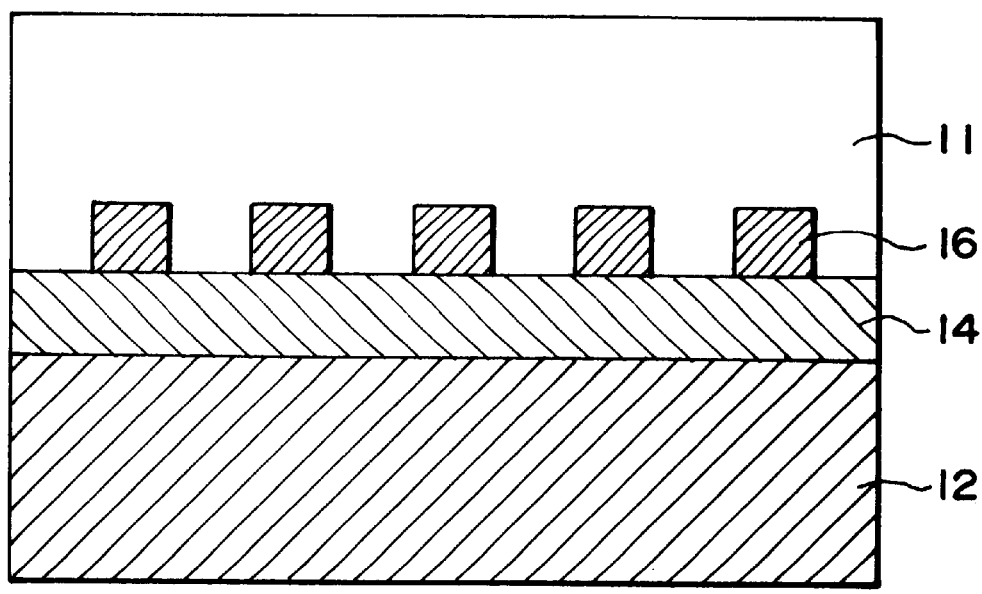
FIG. 1 is a schematic sectional view showing a basic structure of an embodiment of the liquid crystal device according to the invention.

FIG. 1 is a schematic sectional view of an embodiment of the liquid crystal device according to the present invention. Referring to FIG. 1, the liquid crystal device includes a liquid crystal layer 11 preferably comprising a smectic liquid crystal composition; a substrate 12 of a material, such as glass or plastic, that shows a high transmittance, as desired; and an electrode 14 for applying a voltage to the liquid crystal device layer 11.

On the electrode 14 is disposed a patterned alignment control layer 16 for controlling the alignment state of the liquid crystal 11, which has been provided with a uniaxial alignment control power as a result of a uniaxial aligning treatment applied thereto. Such an alignment control layer 16 may be formed on the substrate 12 (more specifically on the electrode 14 thereon) by solution coating, vapor deposition or sputtering of an inorganic material, such as silicon monoxide, silicon dioxide, aluminum oxide, zirconia, magnesium fluoride, cerium oxide, cerium fluoride, silicon nitride, silicon carbide, or boron nitride or an organic material, such as polyvinyl alcohol, polyimide, polyamideimide, polyester, polyamide, polyesterimide, polyparaxylylene, polycarbonate, polyvinyl acetal, polyvinyl chloride, polystyrene, polysiloxane, cellulosic resin, melamine resin, urea resin or acrylic resin, followed by surface rubbing with a fibrous material, such as velvet, cloth or paper. It is also possible to form such an alignment control layer 16 by vapor deposition of an oxide, such as SiO or a nitride from an oblique direction onto the substrate.

Such an alignment control layer may be patterned simultaneously with or after formation thereof on the substrate. The patterning into a desired shape may be effected by a method such as mask etching, lifting-off or UV-ashing. It is also possible to form a photosensitive organic film for easy patterning into a patterned alignment control layer. For the patterning into a desired shape simultaneously with the formation of an alignment control layer, it is possible to apply a method, such as offset printing, ink jet printing or bubble jet printing.

For the preparation of a liquid crystal device according to the present invention, a liquid crystal material or composition having no cholesteric phase is suitably used. For example, 2-phenylnaphthalene derivatives have been reported as bar-shaped liquid crystal materials having a high carrier-transporting characteristic (1988 Japan Liquid Crystal Society Forum, 3A15, Masahiro FUNABASHI and Junichi HANNA). Among these, good results have been attained with respect to carrier mobility and temperature-dependence thereof by a smectic liquid crystal which has no cholesteric phase to cause an isotropic-smectic phase transition.

When such a liquid crystal material is subjected to isotropic-smectic phase transition, there occurs a process wherein minute smectic liquid crystal nuclei called batonnets are formed and rapidly grown in a direction normal to the smectic layers, while gradually enlarging the area of the batonnets in the smectic layer direction. In this instance, if the substrate surface is provided with a local distribution of uniaxial alignment control force, surface energy or wettability with the liquid crystal, the site of the minute smectic nuclei (batonnets) generation can be selected. By utilizing the anisotropic batonnet growth direction and batonnet nuclei generation local selectivity in combination, a uniform liquid crystal alignment can be realized by applying a strong alignment control force to portions on the substrate boundary and not applying such alignment control force to the other portions of the substrate boundary within a liquid crystal device.

In the case of using a liquid crystal device according to the present invention for constituting a carrier-transporting device such as a semiconductor device or a liquid crystal device such as an EL device or an LED device, it is preferred that the liquid crystal has a higher liquid crystal order. Preferred examples thereof include: smectic A phase, smectic C phase and chiral phases corresponding to these. Still further higher liquid crystal order is given by higher order smectic phase inclusive of smectic B phase, smectic E phase, smectic F phase, smectic I phase, smectic H phase and chiral phases corresponding to these phases.

In the case of using a liquid crystal alignment control method and a liquid crystal device according to the present invention for constituting, e.g., a liquid crystalline carrier-transporting device, it is possible to minimize or completely remove an insulating film, etc., which would otherwise be liable to obstruct the liquid crystal molecules from receiving electrons or holes from the electrode, and also to uniformly align liquid crystal directors (molecular long axes) in one direction desirable for realizing polarization light emission or directive light emission over a large area. This is accomplished by disposing an alignment control layer exhibiting a strong uniaxial alignment control power locally within a liquid crystal device and minimizing or completely obviating the presence of an insulating film functioning as an electrical obstacle for carrier delivery with liquid crystal molecules as mentioned above in the regions where the liquid crystal molecules are driven, while also minimizing or completely removing the uniaxial alignment control power or mutual interaction with the liquid crystal molecules in the regions of drive.

The minimization or complete removal of the uniaxial alignment control power may be accomplished by the absence of aligning treatment, such as rubbing, but can also be substantially realized by the provision of a film of high hardness, like films of most inorganic materials such as ITO and metal oxides, which is not substantially provided with a uniaxial alignment power even if subjected to an ordinary level of surface-rubbing, etc., i.e., not causing a change in liquid crystal molecule order parameter by such rubbing.

As mentioned above, it is possible to adopt a structure wherein an electrode material, such as a metal, ITO or a metal oxide, directly contacts the liquid crystal layer. However, in order to grow a batonnet generated from a strong uniaxial alignment control power site continuously to a drive region with substantially no uniaxial alignment control power, it is preferred to provide an alignment control layer in a drive region of substantially no uniaxial alignment control power with a lower mutual interaction with the liquid crystal than the portion of alignment control layer having a strong uniaxial alignment control power. This is accomplished by controlling the wettability, contact angle and surface energy of the substrate boundary with the liquid crystal.

More specifically, according to our study, such a low mutual interaction with the liquid crystal can be realized by providing the substrate boundary with the liquid crystal with a lower wettability (increased repellency), an increased contact angle, and a smaller energy dispersion term ($\gamma^d$) with respect to the liquid crystal.

As a result of the above measure, the "isotropic phase→liquid crystal phase transition temperature" of the liquid crystal becomes lower on the alignment control layer having substantially no uniaxial alignment control power and a lower mutual interaction with the liquid crystal than on the alignment control layer having a strong uniaxial alignment control power on at least one substrate. In this instance, however, it is necessary that the presence of the alignment control layer having a lower mutual interaction with the liquid crystal does not obstruct the delivery of carriers between the electrode and the liquid crystal, as is understood from the above discussion.

More specifically, the wettability and contact angle can be controlled by not using an insulating material below the alignment control layer and controlling a surface shape of the lower layer material, such as metal. It is also possible to use a film of an organic material showing a low resistivity or a silicate film containing oxide fine particles dispersed therein, thereby providing a film showing a lower resistivity and a surface energy dispersion term which is lower than that of an ordinary alignment film material, such as polyimide, so as to lower the mutual interaction of the film with the liquid crystal. On such a film having a lower mutual interaction, an alignment film material, such as polyimide, may be formed in a substantially large thickness of several hundred Å or larger, followed by patterning and then rubbing (or followed by rubbing and then patterning). As a result, the substrate may be provided with regions of the alignment control layer having a strong uniaxial alignment control power and regions of the alignment control layer having substantially no uniaxial alignment control power and having a lower interaction with the liquid crystal at respectively prescribed regions on the substrate.

However, if the surface energy of the alignment control layer having substantially no uniaxial alignment control power is excessively low, the liquid crystal in contact therewith is liable to be homeotropically aligned, thus failing to exhibit desired properties, so that the surface energy has to be appropriately controlled at an optimum level. By disposing a smectic liquid crystal composition as will be described hereinafter in such a device structure including regions of the alignment control layer having a strong uniaxial alignment control power and regions of the alignment control layer having no uniaxial alignment control power and a lower mutual interaction with the liquid crystal, a device exhibiting good carrier injection characteristic and carrier mobility can be provided.

Typical states of alignment development in such a liquid crystal device provided with a patterned alignment control layer as observed through a polarizing microscope during an isotropic-smectic phase transition process are shown in FIGS. 2 (2A–2C), 3 (3A–3C) and 4 (4A–4C) for three types of liquid crystal devices, wherein numeral 12 denotes a substrate provided with an electrode; 16, an alignment control layer subjected to a uniaxial aligning treatment; 21, a smectic liquid crystal nucleus called a batonnet generated during isotropic-smectic phase transition; and 22, a uniaxial alignment direction (rubbing direction).

Figure 3A:
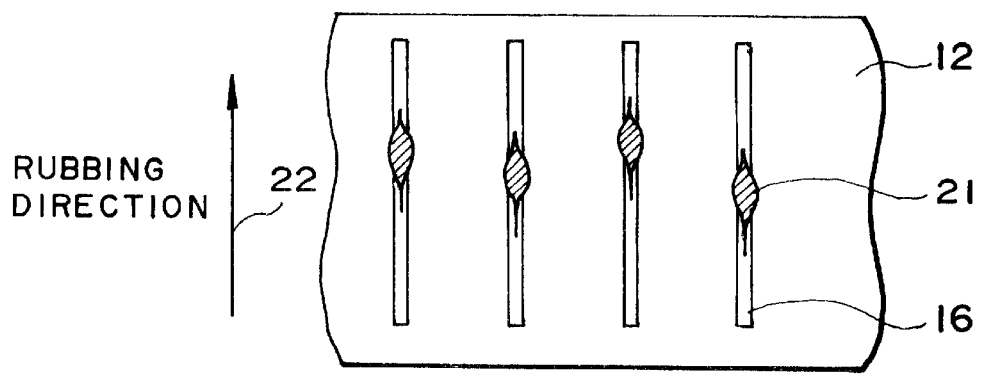
FIGS. 3A–3C are schematic plan views for illustrating typical states of alignment development in another liquid crystal device according to the invention during an isotropic-smectic phase transition process as observed through a polarizing microscope.
Figure 3B:
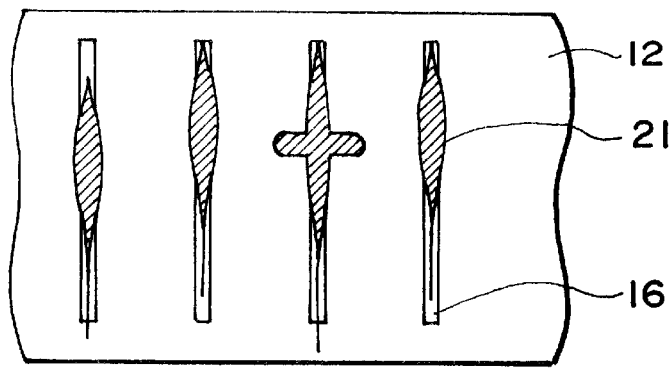
Figure 3C:
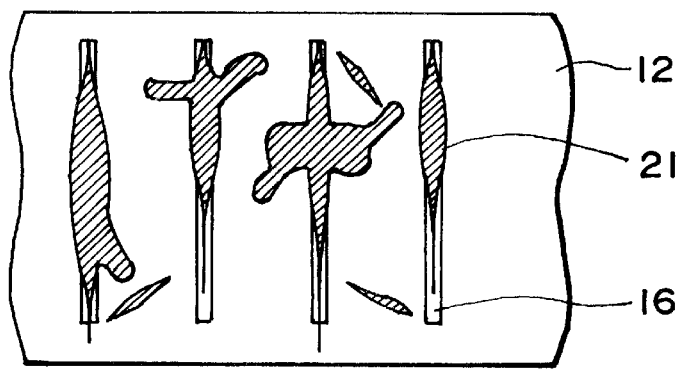
Figure 4A:
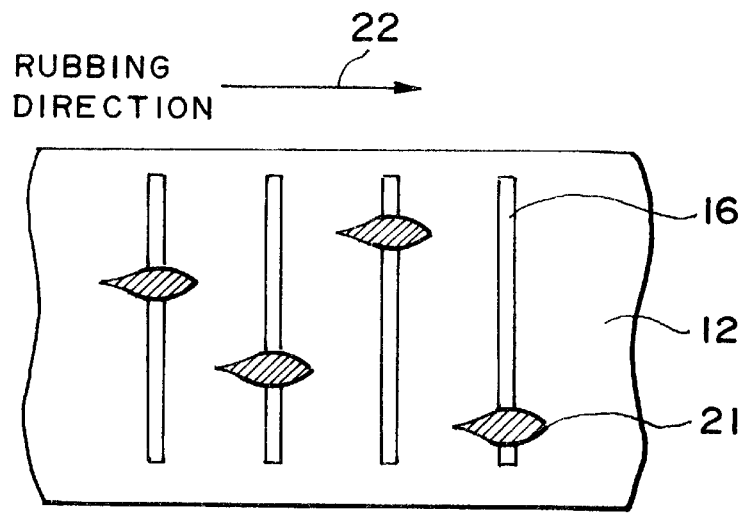
FIGS. 4A–4C are schematic plan views for typical states of alignment development in another liquid crystal device subjected to an aligning treatment in a direction different from those adopted in the devices of FIGS. 2 and 3 as observed through a polarizing microscope.

FIGS. 2 and 3 show cases wherein uniaxial alignment directions are parallel to the extension pattern of the alignment control layers 16, and FIG. 4 shows a case wherein the uniaxial alignment direction is perpendicular to the extension pattern of the alignment control layer 16. In any case, batonnets 21 are generated on the alignment control layer 16 having a strong uniaxial alignment control power and are caused to grow as represented by changes from FIGS. 2A–4A to FIGS. 2D–4D as the temperature is lowered from the isotropic phase.

More specifically, in the cases of FIGS. 2 and 3, wherein the alignment control layer 16 has been subjected to a uniaxial aligning treatment in the direction 22 parallel to the extension pattern thereof, batonnets 21 are generated on the alignment control layer 16 having a strong uniaxial alignment control power as the temperature is lowered and grown rapidly in the pattern extension direction of the alignment control layer 16 as the temperature is further lowered. More specifically, batonnets 21 generally have an anisotropy in their growth that they grow preferentially in a normal to the smectic layers, and due to agreement of the smectic liquid crystal growth direction anisotropy and the pattern extension direction of the alignment control layer 16, the batonnets 21 grow quickly along the pattern extension of the alignment control layer 16.

On further cooling, batonnets 21 not only grow in the pattern extension of the alignment control layer 16, but also start to thicken in a direction perpendicular to the pattern extension. In this instance, it is a general tendency that the batonnets 21 not only grow by gradual thickening, but also extend branches from their sides as shown in FIG. 2C until the neighboring batonnets 21 join with each other to develop a uniform alignment state, wherein smectic layer directions are uniformized even at regions where no uniaxial alignment control power is present.

Incidentally, even in a case as shown in FIGS. 3A–3C, wherein neighboring pattern extensions of the alignment control layer are separated from each other with a relatively large spacing, the above-mentioned branches of batonnets 21 gradually grow in the smectic layer extension direction as shown in FIG. 3B, but the branches receive substantially no uniaxial alignment control power over a relatively broad region, whereby the branches do not extend straight, but extend in an oblique direction as shown in FIG. 3C in many cases. As a result, after being cooled into smectic phase entirely, a region of ununiform smectic layer direction is liable to occur at a mid region (or a central region in an alignment control layer region having no uniaxial alignment control force) between neighboring pattern extensions of the alignment control layer 16.

Figure 4B:
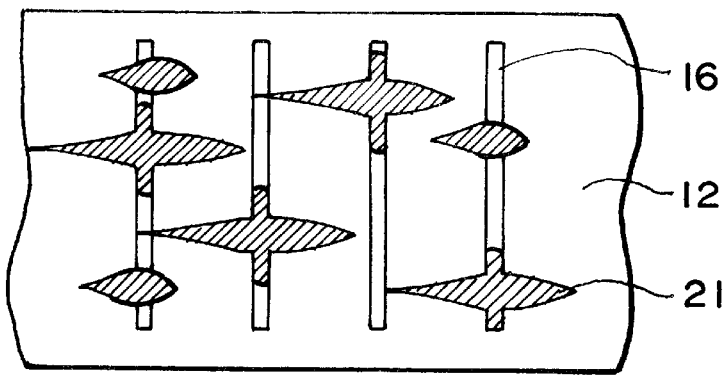
Figure 4C:
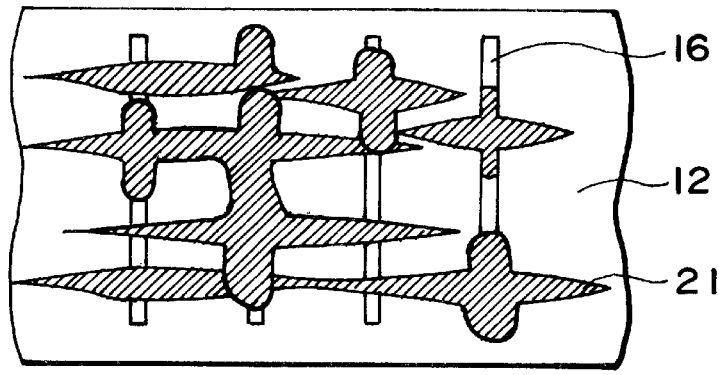

On the other hand, FIGS. 4A–4C show a case wherein neighboring pattern extensions (stripes) of the alignment control layer 16 are separated with a relatively large spacing from each other as in the case of FIGS. 3A–3C, but the alignment control layer 16 has been subjected to a uniaxial aligning control treatment in a direction perpendicular to its pattern extensions. Also in this case, batonnets 21 are generated on the alignment control layer 16 having a uniaxial alignment control power, and on further cooling, grow in a direction normal to the smectic layers as shown in FIG. 4A. More specifically, as shown in FIG. 4A, the batonnets 21 generated on the alignment control layer 16 are caused to grow straight in a direction normal to the smectic layers determined by the batonnet nucleus even in a region where no uniaxial alignment control power is present due to its batonnet growth anisotropy of preferential growth in the smectic layer normal direction. Thus, due to the inherent smectic liquid crystal growth anisotropy, the uniformity of smectic layer alignment can be retained even in a region with no or only weak alignment control power.

On further cooling, the batonnets 21 not only grow in the direction of the uniaxial alignment control power, but also grow (or thicken) in a direction perpendicular thereto (i.e., in a smectic layer direction). In this instance, similarly as in the case of FIG. 3B, not only the batonnets 21 gradually thicken, but also branches appear from sides of the batonnets in general cases. The branches grow gradually in the layer direction, particularly preferentially along pattern extensions (stripes) of the alignment control layer as shown in FIGS. 4B and 4C. Accordingly, as different from the case where the uniaxial alignment treatment is applied in parallel with pattern extensions of the alignment control layer 16 as in the case of FIG. 3C, the layer direction at the branches is not bent. As a result, after the entire area of the liquid crystal is cooled into smectic phase, the layer direction can be uniformly controlled even at regions where no uniaxial alignment control force is present. In this way, in order to retain the uniformity of smectic layer direction during the branch growth stage, it is preferred that the alignment control layer 16 is in a pattern extending continuously or nearly continuously in a smectic layer direction, e.g., in a direction perpendicular to the uniaxial alignment control direction.

Further, in a matrix cell (liquid crystal device) having drive electrodes intersecting at right angles, in order to retain a larger area of effective drive regions, i.e., provide a display device with a larger aperture ratio, the patterned portions of the alignment control layer uniaxially treated to have a uniaxial alignment control force are preferably disposed substantially at non-effective display regions, i.e., outside pixel regions formed at intersecting overlapping regions of drive or display electrodes and along side metal electrodes for enhancing the electroconductivity of the drive electrodes, and the portions not subjected to the uniaxial alignment treatment or having substantially no uniaxial alignment control power of the alignment control layer are preferably disposed substantially at effective display regions of the liquid crystal, i.e., pixel regions formed at intersecting overlapping regions of display stripe electrodes. It is, however, possible that portions of the alignment control layer having a strong uniaxial alignment control power are disposed auxiliarly at a portion of such display electrode intersecting regions usually forming an effective display region so as to enhance the uniform alignment characteristic.

In this instance, in order to obviate an excessive decrease of the effective display area or aperture ratio, it is, of course, preferred that the portions of the alignment control layer not subjected to uniaxial alignment treatment or having substantially no uniaxial alignment control force, thus forming an effective drive region, occupy a larger area than the portions of the alignment control layer having a uniaxial alignment control force, thus forming a non-drive region. According to our study, the alignment control performance is determined not simply by such an areal ratio between the two types of portions, but more significantly by a width of a portion of uniaxial alignment control layer not subjected to uniaxial aligning treatment or having substantially no uniaxial alignment control power (referred to as "B-region") present between a pair of portions (referred to as "A-region(s)") of uniaxial alignment control layer having a uniaxial alignment control power. More specifically, the uniform alignment characteristic was not substantially changed by changing the width of the A-region of alignment control layer (of, e.g., polyimide) from 2 to 10 μm if the width of the B-region is fixed at a certain value (one of, e.g., 4 μm, 8 μm, 16 μm and 32 μm), whereas the uniform alignment characteristic could worsen if the width of the B-region was increased. As a result of examination by changing materials of the A-region and B-region and cell preparation conditions, inclusive of the rubbing condition, a uniform alignment state could be attained up to a B-region width of ca. 40 μm at an A-region with of 4 μm, if the A-regions advantageously affecting the uniform alignment were disposed continuously or nearly continuously in a direction of smectic layer extension (FIGS. 4A–4C) as mentioned above. If a uniform alignment state can be formed at such a width or spacing relationship between the A-region and B-region, it is possible to substantially prevent a decrease in aperture ratio in an ordinary display device having a matrix electrode arrangement by disposing the A-region preferentially at the outside-pixel regions.

In the liquid crystal device according to the present invention, the uniaxial alignment control layer formed on at least one of the substrates may comprise an ordinary uniaxial alignment film material, a preferred example of which may include a class of polyimides having a recurring unit represented by the following formula P:

$$(-K-P^{11}-L^{11}-M^{11}-(L^{12})_a-P^{12}-),\qquad \text{Formula P}$$

wherein K is a tetravalent group which is preferably one of

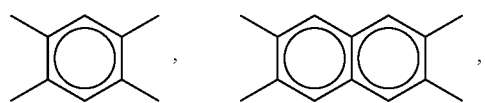

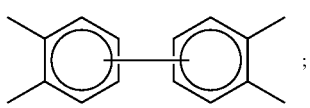

$L^{11}$ and $L^{12}$ independently denote

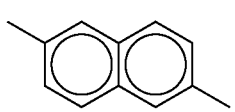

or and alkylene group having 1–20 carbon atoms; $P^{11}$ and $P^{12}$ each represent an imide bond; M denotes a single bond or —O—; and a denotes 0, 1 or 2.

Specific examples of the polyimides may include those having a recurring unit represented by at least one of the following formulae:

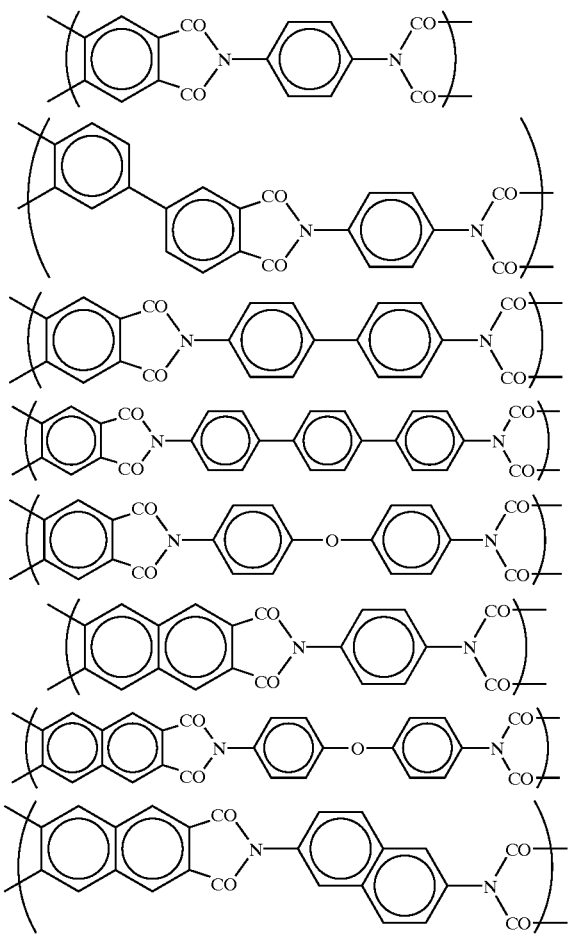

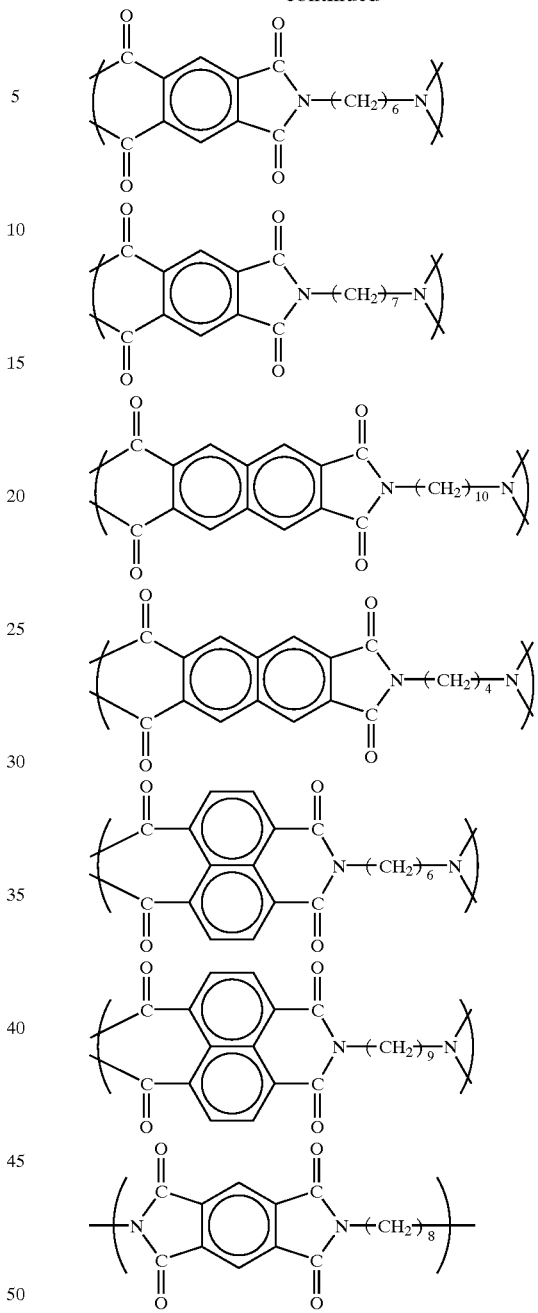

Now, as examples of functional devices to which the liquid crystal device of the present invention is suitably applicable, a carrier-transporting device and a light-emitting device will be described.

A carrier-transporting device is first described. The carrier-transporting device according to the present invention is formed by the above-mentioned liquid crystal device of the present invention, wherein the liquid crystal is used to form a carrier-transporting layer.

Figure 5:
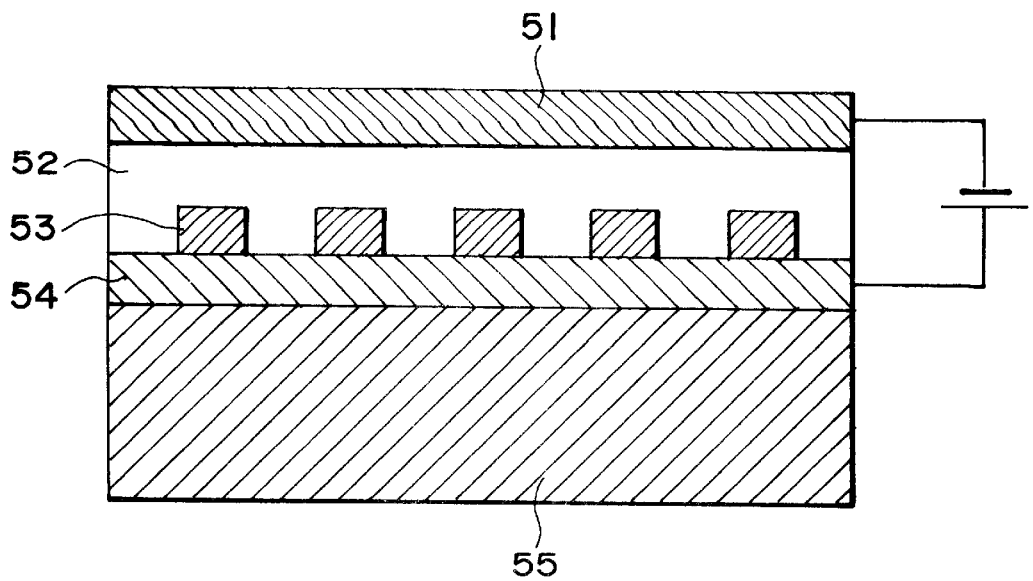
FIG. 5 is a schematic sectional view of an embodiment of the carrier-transporting device according to the invention.

FIG. 5 is a schematic sectional view for illustrating a basic organization of an embodiment of the carrier-transporting device according to the present invention. Referring to FIG. 5, the carrier-transporting device includes a metal electrode 51 functioning, e.g., as a cathode, a carrier-transporting layer (liquid crystal layer) 52, an alignment control layer 53 of, e.g., a polyimide film, a transparent electrode 54 of, e.g., ITO, and a glass substrate 55. The device may be prepared through a process similar to the one described above for preparing a liquid crystal device according to the present invention. More specifically, after forming an electrode 54 of ITO, etc. on a glass substrate 55, portions 53 of a polyimide film are formed by patterning and subjected to rubbing, and a liquid crystal layer 52 is formed thereover, e.g., by spin coating, dipping, vapor deposition or printing. Thereafter, the liquid crystal 52 on the substrate 55 is gradually cooled from its isotropic phase to its smectic phase thereby forming a uniaxial alignment state of the liquid crystal in smectic phase according to the above-described mechanism. Thereafter, on the liquid crystal layer 52, a metal electrode 51 of, e.g., aluminum, is formed, e.g., by vapor deposition, to provide a carrier-transporting device as shown in FIG. 5.

In the device shown in FIG. 5, if the liquid crystal 52 is a so-called electron-transporting material which preferentially exhibits an electron-transporting function to a hole-transporting function, electrons are injected from the metal electrode (cathode) 51 and transported through the liquid crystal layer 52 of the transparent electrode 54 while relatively preventing injection of holes from the transparent electrode (anode) 54 and transportation of the holes through the liquid crystal layer 52, so that the device exhibits a diode characteristic. On the other hand, if the liquid crystal comprises a bipolar carrier-transporting material, the device functions as a bipolar(carrier-transporting) semiconductor or conductor.

The liquid crystal used in the carrier-transporting device of the present invention may preferably comprise a liquid crystal exhibiting a positive or negative carrier mobility of at least $1\times10^{-6}$ $cm^2/Vs$, more preferably at least $1\times10^{-4}$ $cm^2/Vs$, in its aligned liquid crystal state.

Next, a light-emitting device is described. The light-emitting device according to the present invention is formed by the above-mentioned liquid crystal of the present invention, wherein the liquid crystal is used to form a carrier-transporting layer and/or a light-emitting layer. If the liquid crystal layer is used as a light-emitting layer, the light-emitting state can be controlled due to a high order of alignment according to the present invention, so that a type of device including the liquid crystal layer as a light-emitting layer is a preferable one.

Figure 6:
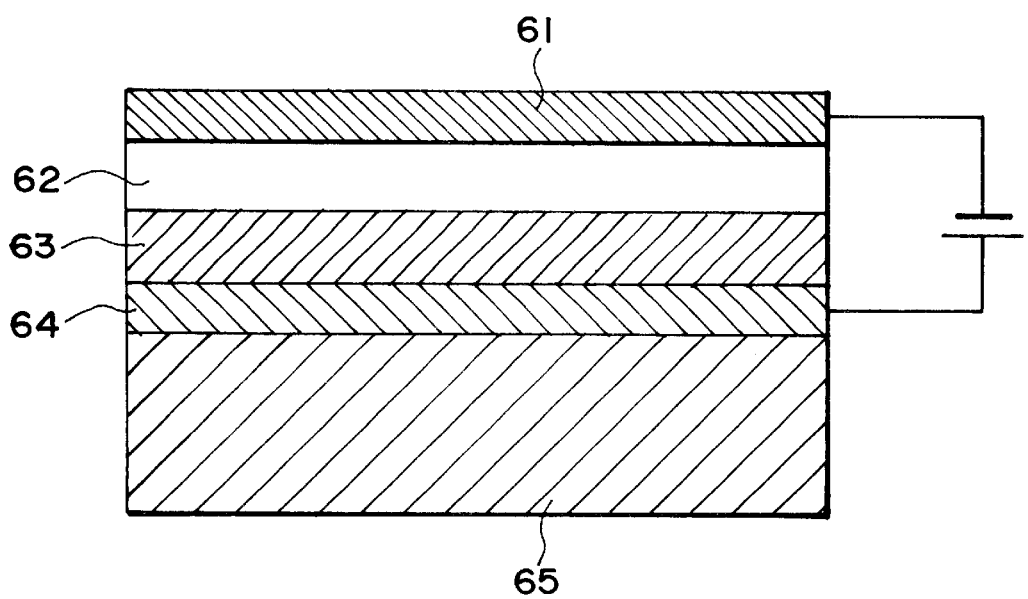
FIG. 6 is a schematic sectional view of an embodiment of the light-emitting device according to the invention.

FIG. 6 illustrates a basic structure of an embodiment of the light-emitting device according to the present invention. Referring to FIG. 6, the light-emitting device includes a metal electrode 61 functioning as a cathode and comprising, e.g., aluminum or aluminum alloy, and an electron-transporting layer 62 which can also function as a light-emitting layer in some cases. In the case where the electron-transporting layer 62 also functions as a light-emitting layer, the layer 62 comprises a liquid crystal aligned according to the present invention. The light-emitting device also includes a hole-transporting layer 63 which can also function as a light-emitting layer alternatively. In the case where the hole-transporting layer 63 also functions as a light-emitting layer, the layer 63 comprises a liquid crystal aligned according to the present invention. Below the hole-transporting layer 63 is disposed a transparent electrode 64 which ordinarily comprises ITO and is formed on a glass substrate 65. FIG. 6 omits the illustration of an alignment control layer for the sake of convenience, but the provision of a patterned alignment control layer is, of course, required at portions contacting the liquid crystal as has been described with reference to FIGS. 1 to 5.

The device of FIG. 6 can be formed similarly as the device of FIG. 5, except for the use of a laminated structure of the hole-transporting layer 63 and the electron-transporting layer 62. These layers may respectively be formed, e.g., by spin coating, dipping, vapor deposition or printing. If a bipolar carrier-transporting material is used, the hole-transporting layer 63 and the electron-transporting layer 62 need not be formed separately, but can be formed in a single layer which comprise a liquid crystal layer exhibiting a bipolar carrier-transporting function and also a light-emitting function and is disposed between the electrodes 51 and 54. By applying a prescribed voltage between the electrodes 51 and 54 of the thus provided light-emitting device, a light emission phenomenon occurs.

The light-emitting mechanism of the light-emitting device is similar to those of so-called organic EL (electroluminescence) devices and organic LEDs (light-emitting diode). Detailed mechanism is described in pages 1 and 125 of a separate volume to "Gekkan (monthly publication) Display", April issue (1998). As a brief description, it is assumed that electrons and holes as carriers are injected from the cathode 51 and the anode 54 and transported to reach molecules having a light-emitting function to excite the molecules, and light is emitted during a process of transition from the excited state to the ground state. As a condition necessary for a liquid crystal layer to cause light emission, molecules having a light-emitting function are required to be present in the liquid crystal layer. This may be satisfied either by a liquid crystal which per se comprises light-emitting molecules or by a combination of a guest of light-emitting molecules and a host of a liquid crystal giving a molecular order and doped with the guest. In the latter case, the guest light-emitting substance functioning as a dopant may preferably comprise molecules having a liquid crystal-like structure to exhibit a good uniaxial alignment characteristic, each as dye molecules exhibiting dichroism. Preferred examples of such guest light-emitting substances may include those enumerated below.

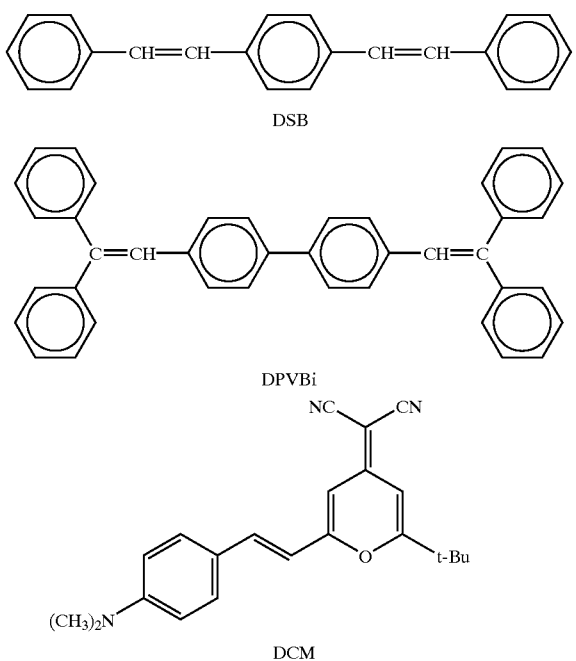

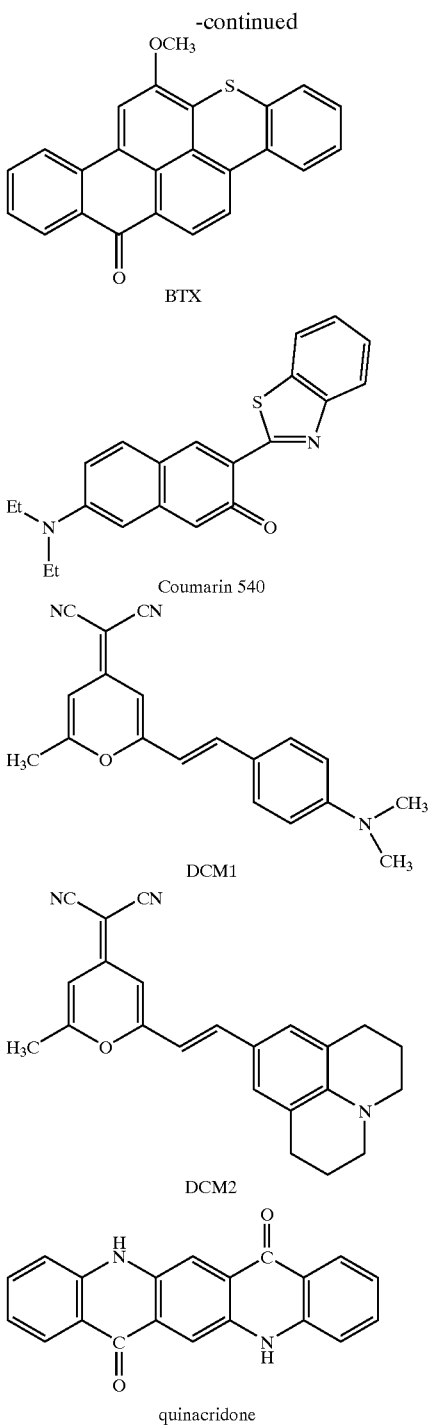

BTX

Coumarin 540

DCM1

DCM2 quinacridone

In the light-emitting device according to the present invention, at least one of the electron-transporting layer, hole-transporting layer and light-emitting layer is formed as a layer including a liquid crystal, and the liquid crystal layer is aligned in a highly uniaxially alignment-controlled state according to the organization adopted in the liquid crystal device of the present invention.

As a result of our study, it has been also found that the light-emitting diode including a highly aligned liquid crystal layer can emit light which has been polarized and/or exhibits directivity. By utilizing this property, it is possible to provide a polarized light-emitting device which can be used as a backlight suitable for providing a twisted nematic (TN)-liquid crystal display device not requiring a polarizer. It is also possible to provide a directive light-emitting diode which can be constituted as a light-emitting device having light-emitting elements arranged in a line or a matrix, suitable for providing a high resolution small display device or a light source for a high resolution electrophotographic apparatus.

EXAMPLES

Hereinbelow, the present invention will be described in further detail based on Examples and Comparative Examples.

Examples 1–2 and Comparative Examples 1–2

Four types of substrates were prepared in the following manner described with reference to FIGS. 7 and 8.

Substrate A (Comparative Example 1)

A 1.1 mm-thick glass substrate 83 provided with a 70 nm-thick transparent electrode 82 of ITO was coated with a precursor of a polyimide having the following recurring unit by spin coating, followed by 5 minutes of pre-drying at 80° C. and 1 hour of baking at 200° C., to form a 5 nm-thick film of polyimide as an alignment control layer.

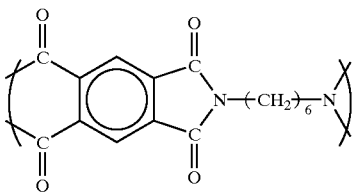

Then, the polyimide film on the substrate was subjected to a uniaxial aligning treatment by rubbing with nylon cloth wound about a 10 cm-dia. roller using a pressing depth of 0.3 mm, a feed speed of 10 cm/second and a rotation speed of 1000 rpm, and rubbing four times, to obtain Substrate A.

Substrate B (Comparative Example 2)

A 1.1 mm-thick glass substrate 83 coated with a 70 nm-thick ITO film 82 but with no polyimide film was subjected to the same uniaxial aligning treatment (rubbing) as in Comparative Example 1, thereby providing Substrate B.

Substrate C (Example 1)

A 1.1 mm-thick glass substrate 83 provided with a 70 nm-thick transparent electrode 82 of ITO was coated with the precursor of a polyimide as used in Comparative Example 1, followed by 5 minutes of pre-drying at 80° C. and 1 hour of baking at 200° C., to form a 50 nm-thick film of polyimide as an alignment control layer.

The polyimide film was coated with a positive resist-forming liquid ("OFRR-800", mfd. by Tokyo Ohka Kogyo K.K.) by spin coating and pre-dried at 80° C. for 30 minutes to form a 2 $\mu$m-thick positive resist film, which was then exposed for 16 seconds to ultraviolet rays ($\lambda$=365 m) through a mask having a pattern as shown in FIG. 7 including a mask width L1 of 4 $\mu$m and a spacing L2 of 16 $\mu$m. Then, the exposed resist film was developed with an organic developer liquid ("MFC-26", mfd. by Shipley Co.) and washed for 3 minutes with flowing water, followed by pre-drying at 100° C. for 10 minutes. Then, the substrate held at a temperature of 60° C. was subjected to UV-ashing with ultraviolet rays (λ=254 nm) at an intensity of 10 J/cm² from a low-pressure mercury lamp, thereby removing portions of the polyimide exposed through the resist pattern. Then, the resist pattern was stripped off with a stripping liquid ("Resist Strip N-320", mfd. by Nagase Sangyo K.K.). Then, the substrate was washed with flowing water and dried to provide a substrate with a pattern of 50 nm-thick polyimide stripes in a width of 4 μm with a polyimide-free stripe region between each pair of neighboring polyimide stripes.

A schematic sectional view of the thus-prepared substrate is shown in FIG. 8. As shown in FIG. 8, the substrate was provided with 50 nm-thick polyimide film stripe 81 in a width L1 of 4 μm spaced apart from each other with a spacing of L2 of 16 μm on an ITO film 82 and a glass substrate 83. Then, the substrate surface having the polyimide stripes 81 was subjected to a uniaxial aligning treatment (rubbing) under the same conditions as in Comparative Example 1, but in a direction perpendicular to the direction of extension of the polyimide stripes 81, thereby obtaining Substrate C.

Substrate D (Example 2)

Substrate D was prepared in the same manner as in Example 1 (for preparation of Substrate C), except that the polyimide film thickness was changed to 30 nm.

Substrates A–D prepared above were each coated with the following liquid crystal compound in a thickness of 200 nm by spin coating and gradually cooled from an isotropic temperature (125° C.) to a smectic A phase temperature (110° C.) of the liquid crystal at a rate of 1° C./minute to obtain Devices (liquid crystal devices) A–D.

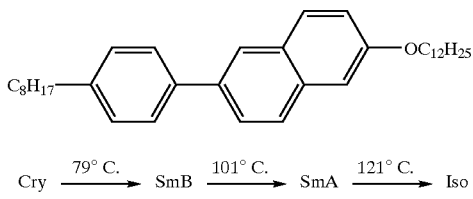

The alignment uniformity of the liquid crystal in each of the above-prepared Devices A–D was observed through a polarizing microscope, whereby results shown in the following Table 1 were obtained.

TABLE 1

| Device | Alignment State |
|---|---|
| A (Comp. Ex. 1) | uniform over the entire area |
| B (Comp. Ex. 2) | random over the entire area |
| C (Example 3) | uniform over the entire area |
| D (Example 2) | uniform over the entire area |

Comparative Example 3, Example 3

A liquid crystal mixture was prepared by doping the liquid crystal compound used in Devices A–D with 2 wt. % of the following guest light-emitting substance:

DSB

Devices B' and C' were prepared in the same manners as in the preparation of Devices B and C, respectively, except for using the above-prepared liquid crystal mixture instead of the liquid crystal compound. Then, a 50 nm-thick aluminum electrode was formed by valor deposition on each liquid crystal of Devices B' and C' to form Devices B" and C" (light-emitting devices).

Each of Devices B" and C" was subjected to a voltage application of 45 volts between the aluminum and ITO electrodes, whereby light emission was confirmed by the respective devices as observed through the glass substrates. As a result, it was confirmed that the liquid crystal compound was a bipolar carrier-transporting material, and the light emission was realized by the presence of the guest compound DSB. As a result of observation of emitted light through a polarizes, the emitted light from Device C" was confirmed to be polarized, whereby no polarization was observed with respect to the emitted light from Device B".

Further, each device was rotated in a plane including a normal to the substrate and the rubbing axis to detect light quantities at a position in front of the device and a position at a viewing angle of 45 degrees by means of a photomultiplier, whereby the light quantity difference between the front and 45 degree position was clearly larger in Device C" than in Device B", so that a directive light emitting characteristic of Device C" was confirmed. Further the emitted light luminance of Device B" was clearly lower than Device C", i.e., a light quantity of 54% of the latter.

Comparative Example 4

Device A" was prepared in the same manner as Device C" in Example 3, except for using Substrate A instead of Substrate C, whereas almost no light emission was observed.

Example 4

Device D" was prepared in the same manner as Device C" in Example 3, whereby light-emitting performances similar to those of Device C" were observed.

As described in the above Examples, a uniform alignment characteristic and a high liquid crystal alignment order were satisfied in combination by using a substrate provided with regions of alignment control layer having a uniaxial alignment control power and regions having no alignment control power in mixture or disposed in parallel.

As described above, according to the present invention, it has become possible to provide a liquid crystal device wherein a high liquid crystal alignment order is realized over an entire area including regions retaining an electrode not covered by an insulating alignment control film, whereby it becomes possible to provide high performance carrier-transporting devices such as a semiconductor device and light-emitting devices such as an EL device and an LED device. Further, it is possible to provide a novel liquid crystal device by utilizing a highly aligned liquid crystal structure.

What is claimed is:
1. A liquid crystal device comprising:
   a substrate having an electrode thereon, and a liquid crystal disposed on the substrate, wherein the liquid crystal exhibits an isotropic-smectic liquid crystal phase transition characteristic and has a charge-transporting function in the liquid crystal phase, and wherein the substrate is provided with portions of an alignment control layer having a uniaxial alignment control power locally formed thereon, whereby the liquid crystal is placed in an alignment state which has been formed through a process of isotropic-smectic liquid crystal transition on temperature decrease wherein a smectic liquid crystal phase is first generated in regions in contact with the portion of alignment control layer and continuously enlarged in a direction of the uniaxial alignment control power.

2. The liquid crystal device according to claim 1, wherein the portions of the alignment control layer are selectively formed in a pattern including a plurality of stripes extending in a direction identical to or perpendicular to a direction of the uniaxial alignment control power.

3. The liquid crystal device according to claim 2, wherein the stripes of the alignment control layer are formed in a width which is smaller than a spacing between a pair of adjacent stripes of the alignment control layer in a direction perpendicular to the pattern including a plurality of stripes.

4. The liquid crystal device according to claim 1, wherein the portions of the alignment control layer having a uniaxial alignment control power are formed in a total area which is less than a half of a total area of the substrate.

5. The liquid crystal device according to claim 1, wherein the alignment control layer comprises a rubbed organic film.

6. A light-emitting device comprising a liquid crystal device, said liquid crystal device comprising a substrate having an electrode thereon, and a liquid crystal exhibiting an isotropic-smectic liquid crystal phase transition characteristic disposed on the substrate, wherein the substrate is provided with portions of an alignment control layer having a uniaxial alignment control power locally formed thereon, whereby the liquid crystal is placed in an alignment state which has been formed through a process of isotropic-smectic liquid crystal transition on temperature decrease wherein a smectic liquid crystal phase is first generated in regions in contact with the portion of alignment control layer and continuously enlarged in a direction of the uniaxial alignment control power, and including a light-emitting layer.

* * * * *